(12) United States Patent
Zhong et al.

(10) Patent No.: US 11,252,835 B2
(45) Date of Patent: Feb. 15, 2022

(54) BENDABLE COVER, BENDABLE DISPLAY MODULE, AND BENDABLE TERMINAL DEVICE

(71) Applicant: Huawei Technologies Co., Ltd., Shenzhen (CN)

(72) Inventors: Ding Zhong, Dongguan (CN); Wangchun Lyu, Shenzhen (CN); Zhaoliang Su, Dongguan (CN); Wen Fan, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 81 days.

(21) Appl. No.: 16/811,308

(22) Filed: Mar. 6, 2020

(65) Prior Publication Data

US 2020/0214156 A1 Jul. 2, 2020

Related U.S. Application Data

(63) Continuation of application No. PCT/CN2018/092913, filed on Jun. 26, 2018.

(30) Foreign Application Priority Data

Sep. 8, 2017 (CN) .......................... 201710803638.2

(51) Int. Cl.
*H05K 5/03* (2006.01)
*G06F 1/16* (2006.01)
*H05K 5/00* (2006.01)

(52) U.S. Cl.
CPC ............. *H05K 5/03* (2013.01); *G06F 1/1652* (2013.01); *H05K 5/0017* (2013.01)

(58) Field of Classification Search
CPC .... G06F 1/1652; G06F 1/1616; G06F 1/1681; G06F 1/1641; H01L 51/0097; H01L 2251/5338; G09F 9/301; H04M 1/0268; H04M 1/0216; H05K 5/0017; H05K 5/03; G02F 1/133305
See application file for complete search history.

(56) References Cited

U.S. PATENT DOCUMENTS

| 2006/0061541 | A1 | 3/2006 | Ou et al. |
| 2009/0168006 | A1 | 7/2009 | Chen et al. |
| 2012/0307423 | A1 | 12/2012 | Bohn et al. |
| 2013/0141847 | A1 | 6/2013 | Ryu |

(Continued)

FOREIGN PATENT DOCUMENTS

| CN | 103152893 A | 6/2013 |
| CN | 103217835 A | 7/2013 |

(Continued)

*Primary Examiner* — James Wu
(74) *Attorney, Agent, or Firm* — Conley Rose, P.C.

(57) ABSTRACT

A display module, a terminal device and a bendable cover, where the bendable cover includes a flexible substrate and hard plates. The flexible substrate has a hard area and a bending area. A quantity of hard areas is the same as a quantity of the hard plates, where the hard areas are in a one-to-one correspondence with the hard plates, and each of the hard plates is located on a surface of a corresponding hard area. There is a bending area between two adjacent hard areas. Under an effect of external force, the bendable cover is capable of bending along the bending area.

20 Claims, 7 Drawing Sheets

(56) References Cited

U.S. PATENT DOCUMENTS

| | | | |
|---|---|---|---|
| 2013/0213565 A1 | 8/2013 | Lee et al. | |
| 2014/0065326 A1 | 3/2014 | Lee et al. | |
| 2014/0287213 A1* | 9/2014 | Lee | B32B 27/08 428/217 |
| 2015/0062927 A1* | 3/2015 | Hirakata | H05K 5/0017 362/362 |
| 2016/0364048 A1 | 12/2016 | Park et al. | |
| 2017/0092884 A1* | 3/2017 | Zhang | G06F 3/0412 |
| 2017/0196101 A1 | 7/2017 | Ki et al. | |
| 2017/0373121 A1 | 12/2017 | Leng et al. | |

FOREIGN PATENT DOCUMENTS

| | | |
|---|---|---|
| CN | 103475756 A | 12/2013 |
| CN | 103620516 A | 3/2014 |
| CN | 203968490 U | 11/2014 |
| CN | 104553210 B | 8/2016 |
| CN | 205946348 U | 2/2017 |
| CN | 106653777 A | 5/2017 |
| CN | 106816530 A | 6/2017 |
| CN | 106886253 A | 6/2017 |
| CN | 106910823 A | 6/2017 |
| WO | 2017052732 A1 | 3/2017 |

* cited by examiner

BENDABLE COVER, BENDABLE DISPLAY MODULE, AND BENDABLE TERMINAL DEVICE

CROSS-REFERENCE TO RELATED APPLICATIONS

This application is a continuation of International Patent Application No. PCT/CN2018/092913 filed on Jun. 26, 2018, which claims priority to Chinese Patent Application No. 201710803638.2 filed on Sep. 8, 2017. The disclosures of the aforementioned applications are hereby incorporated by reference in their entireties.

TECHNICAL FIELD

This application relates to the field of display technologies, and in particular, to a bendable cover, a bendable display module, and a bendable terminal device.

BACKGROUND

As a display screen of a terminal device (for example, a smartphone) is becoming larger and thinner, an area of the terminal device is becoming larger, and consequently it is more difficult for a holder of the terminal device to hold the terminal device with one hand. Therefore, providing a bendable terminal device becomes a hotspot of current technical researches.

The terminal device usually includes a display screen and a cover covering a surface of the display screen. Correspondingly, when the terminal device is bendable, the cover also should be bendable. However, an existing cover is usually a non-bendable glass cover, or an existing cover breaks down after being bent. Therefore, it is currently urgent to provide a bendable cover.

SUMMARY

This application provides a bendable cover that can be bent. Correspondingly, this application further provides a bendable display module including the bendable cover and a bendable terminal device including the bendable display module.

According to a first aspect, this application provides a bendable cover.

The bendable cover includes a first hard plate, a second hard plate, and a flexible substrate. An upper surface of the flexible substrate includes a first hard area, a second hard area, and a first bending area, the first bending area is located between the first hard area and the second hard area, and the first hard area and the second hard area each are adjacent to the first bending area. Further, the first hard plate is bonded to the first hard area using a first transparent bonding layer, and the second hard plate is bonded to the second hard area using a second transparent bonding layer.

Further, when a first bending part is bent, a minimum included angle between a planar surface on which an inner surface of a first hard part is located and a planar surface on which an inner surface of a second hard part is located is greater than or equal to 0 degrees and less than 180 degrees.

The first bending part is a flexible substrate corresponding to the first bending area. The first hard part and the second hard part each are in a shape of a slab. The first hard part includes a flexible substrate corresponding to the first hard area, the first hard plate, and the first transparent bonding layer. The second hard part includes a flexible substrate corresponding to the second hard area, the second hard plate, and the second transparent bonding layer.

It should be noted that the inner surface of the first hard part faces the inner surface of the second hard part.

It can be learned from the foregoing description that the bendable cover provided in this implementation includes the first bending part, the first hard part, and the second hard part. Further, the first bending part can be bent when external force is applied, and the first bending part can restore to an original shape after the external force is withdrawn. However, both the first hard part and the second hard part in this implementation cannot be bent. "Both the first hard part and the second hard part cannot be bent" may be as follows. The first hard part and the second hard part may break down when external force is applied, or the first hard part and the second hard part cannot restore to an original shape after the external force is withdrawn.

In this implementation, because the first bending part can be bent, the bendable cover can also be bent after external force is applied. That is, the bendable cover can be bent along the first bending part when external force is applied. Therefore, compared with other approaches cover, the bendable cover in this implementation can be bent.

With reference to the first aspect, in a first possible implementation, a width of the first bending area is greater than or equal to $\pi R$, and R is a minimum curvature radius of the first bending area. It should be learned that a larger width of the first bending area indicates a larger degree at which the bending cover can be bent. That is, a larger width of the first bending area may indicate a shorter distance from the first hard part to the second hard part after the first bending area is bent.

Optionally, a curvature radius of the first bending area is greater than or equal to 4.7 millimeters.

With reference to the first aspect or the first possible implementation of the first aspect, in a second possible implementation, along a thickness direction of the first hard plate, a projection of the first hard plate on a planar surface on which the first hard area is located overlaps the first hard area. Because the bendable cover covers an outer surface of a display screen, in this implementation, an area that is inside the outer surface of the display screen and that corresponds to the first hard area is covered by the first hard plate. That is, the outer surface of the display screen is protected as much as possible.

With reference to the first aspect, the first possible implementation of the first aspect, or the second possible implementation of the first aspect, in a third possible implementation, along a thickness direction of the second hard plate, a projection of the second hard plate on a planar surface on which the second hard area is located overlaps the second hard area. Similar to the previous implementation, in this case, the area that is inside the outer surface of the display screen and that corresponds to the second hard area is covered by the second hard plate such that the outer surface of the display screen is protected as much as possible.

With reference to any one of the first aspect, or the first possible implementation of the first aspect to the third possible implementation of the first aspect, in a fourth possible implementation, edges of the first hard area include an inner edge and an outer edge, the inner edge of the first hard area is a boundary between the first hard area and the first bending area, the other edge in the edges of the first hard area than the inner edge of the first hard area is the outer edge of the first hard area, and the outer edge of the first hard area overlaps a part of an edge of the upper surface of the flexible substrate. It can be easily learned from the foregoing description that, in this implementation, the first hard area is located in an edge area of the upper surface of the flexible substrate.

Optionally, the first hard plate is made of two-and-a-half-dimensional (2.5D) hard glass or three-dimensional (3D) hard glass.

Optionally, the second hard plate is 2.5D hard glass or 3D hard glass.

With reference to any one of the first aspect, or the first possible implementation of the first aspect to the fourth possible implementation of the first aspect, in a fifth possible implementation, when the first bending part is bent, along a thickness direction of the second hard part, a projection of the first hard part on the planar surface on which the inner surface of the second hard part is located is located inside the inner surface of the second hard part.

With reference to any one of the first aspect, or the first possible implementation of the first aspect to the fifth possible implementation of the first aspect, in a sixth possible implementation, a thickness of a hard plate is greater than or equal to 0.3 millimeter and less than or equal to 0.8 millimeter, and the hard plate includes the first hard plate and the second hard plate.

Optionally, a thickness of the first hard plate is equal to a thickness of the second hard plate.

With reference to any one of the first aspect, or the first possible implementation of the first aspect to the fifth possible implementation of the first aspect, in a seventh possible implementation, a material of which a hard plate is made is glass or polymethyl methacrylate (PMMA), and the hard plate includes the first hard plate and the second hard plate.

Optionally, a material of which the first hard plate is made is the same as a material of which the second hard plate is made.

With reference to any one of the first aspect, or the first possible implementation of the first aspect to the fifth possible implementation of the first aspect, in an eighth possible implementation, a hardness of the hard plate is greater than or equal to 8H, where H is a pencil hardness, and the hard plate includes the first hard plate and the second hard plate.

Optionally, a hardness of the first hard plate is the same as a hardness of the second hard plate.

With reference to any one of the first aspect, or the first possible implementation of the first aspect to the eighth possible implementation of the first aspect, in a ninth possible implementation, a light transmittance of a transparent bonding layer is greater than or equal to 91%, and the transparent bonding layer includes the first transparent bonding layer and the second transparent bonding layer. The light transmittance of the transparent bonding layer is limited in order to ensure that an image displayed on the display screen can be clearly viewed by a holder of a terminal device. It should be learned that a surface of the display screen is covered by the bendable cover in this implementation, and the terminal device includes the display screen.

Optionally, a light transmittance of the first transparent bonding layer is equal to a light transmittance of the second transparent bonding layer.

With reference to any one of the first aspect, or the first possible implementation of the first aspect to the ninth possible implementation of the first aspect, in a tenth possible implementation, the flexible substrate is a glass film or a plastic film. The flexible substrate is limited to a film in order to ensure that the flexible substrate can be bent.

Optionally, a thickness of the flexible substrate is greater than or equal to 0.07 millimeter and less than or equal to 0.15 millimeter.

Optionally, a hardness of the flexible substrate is greater than or equal to 8H.

Optionally, the thickness of the flexible substrate is even.

With reference to any one of the first aspect, or the first possible implementation of the first aspect to the tenth possible implementation of the first aspect, in an eleventh possible implementation, a light transmittance of the flexible substrate is greater than or equal to 91%. As described above, the bendable cover in this implementation covers an outer surface of the display screen. Therefore, a higher light transmittance of the flexible substrate indicates a clearer image that is displayed on the display screen and that is viewed through the bendable cover.

With reference to any one of the first aspect, or the first possible implementation of the first aspect to the eleventh possible implementation of the first aspect, in a twelfth possible implementation, the first hard plate further has a first curved surface. The first curved surface is located between an upper surface of the first hard plate and an inner wall of the first hard plate. The first curved surface is a convex surface, and the first curved surface has a first edge and a second edge that are opposite to each other.

It should be noted that an intersecting line between the first curved surface and the upper surface of the first hard plate is the first edge of the first curved surface, and an intersecting line between the first curved surface and the inner wall of the first hard plate is the second edge of the first curved surface. It should be noted that the first curved surface is of curvature (G2) continuity from the first edge of the first curved surface to the second edge of the first curved surface.

In this implementation, it should be explained that the upper surface of the first hard plate is opposite to a lower surface of the first hard plate, the lower surface of the first hard plate faces the first hard area, and the inner wall of the first hard plate faces a side wall of the second hard plate.

In other implementations before this implementation, it is described that the first bending part of the bendable cover can be bent. In this implementation, the first hard plate further has the first curved surface and a condition that the first curved surface needs to meet is further provided. It should be noted that, when the first bending part is bent, a design of the first curved surface helps prevent a sharp corner that is inside the first hard plate and that is close to the second hard plate and a sharp corner that is inside the second hard plate and that is close to the first hard plate from being squeezed. This reduces a probability that the first hard plate is damaged to some extent.

With reference to the twelfth possible implementation of the first aspect, in a thirteenth possible implementation, an included angle area between the inner wall of the first hard plate and the first bending area has a first gel.

Further, the first gel has a side wall, a lower surface, and a second curved surface, the side wall of the first gel is fitted to the inner wall of the first hard plate, and the lower surface of the first gel is fitted to the first bending area.

Further, the second curved surface is a concave surface, and the second curved surface has a first edge and a second edge that are opposite to each other. The first edge of the second curved surface is an intersecting line between the side wall of the first gel and the second curved surface, and the second edge of the second curved surface is an intersecting line between the lower surface of the first gel and the second curved surface.

It should be noted that the second curved surface is of G2 continuity from the first edge of the second curved surface to the second edge of the second curved surface.

It should be further noted that the first edge of the second curved surface overlaps the second edge of the first curved surface.

In this implementation, the first gel is further limited. A design of the first gel avoids a segment difference occurring when transition from the upper surface of the first hard plate to the first bending area is performed, and further avoids a case in which there is air between the bendable cover and the display screen because of the segment difference when the bendable cover is fitted to the display screen.

It should be noted that a hard surface of the bendable cover is opposite to a flexible surface of the bendable cover, the flexible surface of the bendable cover is a lower surface of the flexible substrate located inside the bendable cover, and the lower surface of the flexible substrate is opposite to the upper surface of the flexible substrate.

Optionally, along the thickness direction of the first hard plate, a projection of the first hard plate on the upper surface of the flexible substrate completely overlaps a projection of the first transparent bonding layer on the upper surface of the flexible substrate. In this case, the side wall of the first gel may include a first part and a second part. The first part is fitted to the inner wall of the first hard plate, and the second part is fitted to an inner wall of the first transparent bonding layer. It should be learned that the inner wall of the first hard plate and the inner wall of the first transparent bonding layer are located on a same planar surface.

With reference to the thirteenth possible implementation of the first aspect, in a fourteenth possible implementation, the first curved surface and the second curved surface form a continuous curved surface, and the continuous curved surface is of G2 continuity from the first edge of the first curved surface to the second edge of the second curved surface.

Because the continuous curved surface is of G2 continuity, the bendable cover can be fitted to the display screen in a seamless manner.

With reference to the thirteenth possible implementation of the first aspect or the fourteenth possible implementation of the first aspect, in a fifteenth possible implementation, along a thickness direction of the flexible substrate, a maximum thickness of the first gel is greater than or equal to 0.2 millimeter and less than or equal to a thickness of the first hard plate.

Optionally, the first gel is light transmissive. The first gel is an optical clear adhesive (OCA) or an ultraviolet (UV) adhesive.

With reference to any one of the first aspect, or the first possible implementation of the first aspect to the fifteenth possible implementation of the first aspect, in a sixteenth possible implementation, the bendable cover further includes a third hard plate. Correspondingly, the upper surface of the flexible substrate further includes a third hard area and a second bending area, the second bending area is located between the second hard area and the third hard area, and the second hard area and the third hard area each are adjacent to the second bending area. The third hard area is bonded to the third hard area using a third transparent bonding layer.

When a second bending part is bent, a minimum included angle between a planar surface on which an inner surface of a third hard part is located and the planar surface on which the inner surface of the second hard part is located is greater than or equal to 0 degrees and less than 180 degrees.

It should be noted that the second bending part is a flexible substrate corresponding to the second bending area. Further, the third hard part is in a shape of a slab, the third hard part includes a flexible substrate corresponding to the third hard area, the third hard plate, and the third transparent bonding layer.

It should be noted that the inner surface of the third hard part faces the inner surface of the second hard part.

In this implementation, the bendable cover further includes the second bending part. That is, the bendable cover may be further bent along the second bending part. Compared with the bendable cover provided in the foregoing implementations, the bendable cover provided in this implementation may further reduce space occupied after the bendable cover is bent.

Optionally, the first hard plate and the third hard plate are symmetrically arranged on the upper surface of the flexible substrate.

Optionally, the third hard plate is 2.5D hard glass or 3D hard glass.

Optionally, the light transmittance of the first transparent bonding layer, the light transmittance of the second transparent bonding layer, and a light transmittance of the third transparent bonding layer are the same.

Optionally, a thickness of the first transparent bonding layer, a thickness of the second transparent bonding layer, and a thickness of the third transparent bonding layer are the same.

Optionally, a width of the second bending area is greater than or equal to $\pi R$, and R is a minimum curvature radius of the second bending area. Further, optionally, a curvature radius of the second bending area is greater than or equal to 4.7 millimeters.

With reference to the sixteenth possible implementation of the first aspect, in a seventeenth possible implementation, along a thickness direction of the third hard plate, a projection of the third hard plate on a planar surface on which the third hard plate is located overlaps the third hard area.

Optionally, a thickness of the third hard plate is greater than or equal to 0.3 millimeter and less than or equal to 0.8 millimeter.

Further, optionally, the thickness of the first hard plate, the thickness of the second hard plate, and the thickness of the third hard plate are the same.

Optionally, a material of which the third hard plate is made is glass or PMMA.

Further, optionally, the material of which the first hard plate is made, the material of which the second hard plate is made, and the material of which the third hard plate is made are the same.

Optionally, a hardness of the third hard plate is greater than or equal to 8H.

Further, optionally, the hardness of the first hard plate, the hardness of the second hard plate, and the hardness of the third hard plate are the same.

With reference to the seventeenth possible implementation of the first aspect, in an eighteenth possible implementation, when the second bending part is bent, along the thickness direction of the second hard part, a projection of the third hard part on the planar surface on which the inner surface of the second hard part is located is located inside the inner surface of the second hard part.

With reference to the eighteenth possible implementation of the first aspect, in a nineteenth possible implementation, when both the first bending part and the second bending part are bent, along the thickness direction of the second hard part, a projection of the first hard part on an inner surface of the second hard plate and a projection of the third hard part on the inner surface of the second hard plate are separated from each other. In this implementation, the first hard plate or the second hard plate is prevented from being worn because of overlapping between the first hard plate and the second hard plate.

With reference to any one of the first aspect, or the first possible implementation of the first aspect to the nineteenth possible implementation of the first aspect, in a twentieth possible implementation, the bendable cover is applied to the terminal device, and is configured to cover the outer surface of the display screen of the terminal device. The bendable cover covers the outer surface of the display screen to protect the display screen. The outer surface of the display screen is a surface that is of the display screen and that is used to display an image.

According to a second aspect, this application provides a bendable display module. The bendable display module includes the bendable cover in any one of the first aspect or the possible implementations of the first aspect and a display screen. The bendable cover covers an outer surface of the display screen.

It should be noted that the outer surface of the display screen is a surface that is of the display screen and that is used to display an image. It should be learned that the display screen can be bent. Therefore, compared with other approaches display module, the display module provided in this application can be bent.

Optionally, the display screen is a touch display screen.

With reference to the second aspect, in a first possible implementation, when the bendable display module is bent to form a bending structure, the display screen is located on an inner side of the bending structure, and the bendable cover is located on an outer side of the bending structure.

With reference to the first possible implementation of the second aspect, in a second possible implementation, the outer surface of the display screen is in contact with a hard surface of the bendable cover, a flexible surface of the bendable cover is an outer surface of the bending structure, and an inner surface of the display screen is an inner surface of the bending structure.

It should be noted that the hard surface of the bendable cover is opposite to the flexible surface of the bendable cover, the flexible surface of the bendable cover is a lower surface of the flexible substrate located inside the bendable cover, and the lower surface of the flexible substrate is opposite to an upper surface of the flexible substrate. Further, the outer surface of the display screen is opposite to the inner surface of the display screen.

With reference to the first possible implementation of the second aspect, in a third possible implementation, the outer surface of the display screen is in contact with a flexible surface of the bendable cover, a hard surface of the bendable cover is an outer surface of the bending structure, and an inner surface of the display screen is an inner surface of the bending structure.

It should be noted that the hard surface of the bendable cover is opposite to the flexible surface of the bendable cover, the flexible surface of the bendable cover is a lower surface of the flexible substrate located inside the bendable cover, and the lower surface of the flexible substrate is opposite to an upper surface of the flexible substrate. Further, the outer surface of the display screen is opposite to the inner surface of the display screen.

With reference to the second aspect, in a fourth possible implementation, when the bendable display module is bent to form a bending structure, the display screen is located on an outer side of the bending structure, and the bendable cover is located on an inner side of the bending structure.

With reference to the fourth possible implementation of the second aspect, in a fifth possible implementation, the outer surface of the display screen is in contact with a hard surface of the bendable cover, a flexible surface of the bendable cover is an inner surface of the bending structure, and an inner surface of the display screen is an outer surface of the bending structure.

It should be noted that the hard surface of the bendable cover is opposite to the flexible surface of the bendable cover, the flexible surface of the bendable cover is a lower surface of the flexible substrate located inside the bendable cover, and the lower surface of the flexible substrate is opposite to an upper surface of the flexible substrate. It should be further noted that the outer surface of the display screen is opposite to the inner surface of the display screen.

With reference to the fourth possible implementation of the second aspect, in a fifth possible implementation, the outer surface of the display screen is in contact with a flexible surface of the bendable cover, a hard surface of the bendable cover is an inner surface of the bending structure, and an inner surface of the display screen is an outer surface of the bending structure.

It should be noted that the hard surface of the bendable cover is opposite to the flexible surface of the bendable cover, the flexible surface of the bendable cover is a lower surface of the flexible substrate located inside the bendable cover, and the lower surface of the flexible substrate is opposite to an upper surface of the flexible substrate. It should be further noted that the outer surface of the display screen is opposite to the inner surface of the display screen.

According to a third aspect, this application further provides a bendable terminal device. The terminal device includes the bendable display module in any one of the second aspect or the possible implementations of the second aspect and a housing supporting part. The housing supporting part is configured to support and fasten the bendable display module. Compared with other approaches terminal device, the terminal device provided in this application can be bent.

With reference to the third aspect, in a first possible implementation, when the bendable terminal device is bent, the housing supporting part is located on an inner side of the bendable terminal device, and the bendable display module is located on an outer side of the bendable terminal device.

With reference to the third aspect, in a second possible implementation, when the bendable terminal device is bent, the housing supporting part is located on an outer side of the bendable terminal device, and the bendable display module is located on an inner side of the bendable terminal device.

BRIEF DESCRIPTION OF DRAWINGS

FIG. 5B is bent forward.

FIG. 5B is bent backward.

DESCRIPTION OF EMBODIMENTS

The following clearly describes the technical solutions in this application with reference to the accompanying drawings in this application. Before the embodiments of this application are described, "bendable" is first explained. The "bendable" means that a bendable cover can be bent under an effect of external force, and can still restore to an original shape after the external force is withdrawn.

Bendable cover.

Figure 1:
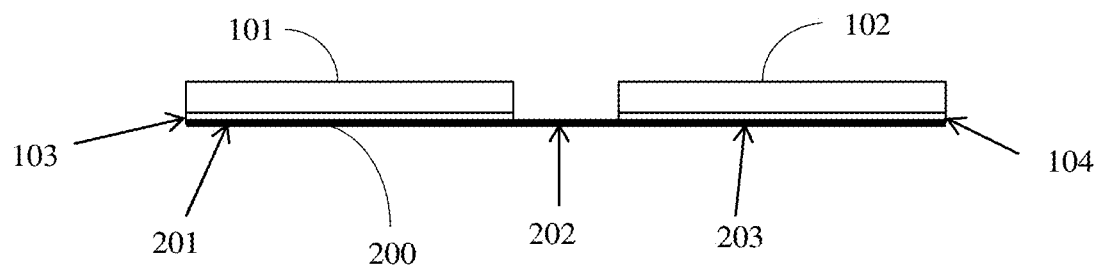
FIG. 1 is a side view of a bendable cover according to this application.

FIG. 1 is a schematic structural diagram of a bendable cover according to this application. It should be learned that the bendable cover is transparent. It should be noted that the bendable cover is usually applied to a terminal device, and is configured to cover a display screen of the terminal device. The terminal device may be a smartphone, a tablet computer (for example IPAD), or another electronic product having a display screen.

Further, the bendable cover includes a first hard plate 101, a second hard plate 102, and a flexible substrate 200. An upper surface of the flexible substrate 200 includes a first hard area 201, a second hard area 203, and a first bending area 202. The first bending area 202 is located between the first hard area 201 and the second hard area 203, and the first hard area 201 and the second hard area 203 each are adjacent to the first bending area 202. It should be noted that the first hard plate 101 is bonded to the first hard area 201 using a first transparent bonding layer 103, and the second hard plate 102 is bonded to the second hard area 203 using a second transparent bonding layer 104.

Optionally, along a thickness direction of the first hard plate 101, a projection of the first hard plate 101 on a planar surface on which the first hard area 201 is located completely overlaps the first hard area 201.

Optionally, along a thickness direction of the second hard plate 102, a projection of the second hard plate 102 on a planar surface on which the second hard area 203 is located completely overlaps the second hard area 203.

Figure 2A:
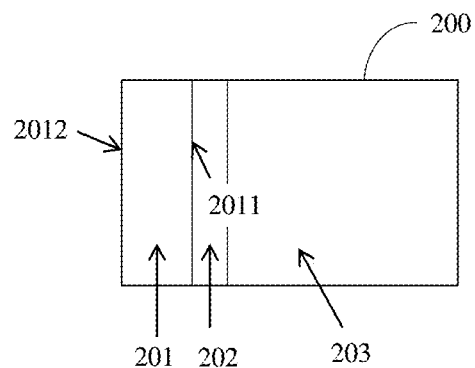
FIG. 2A is a top view of an upper surface of a flexible substrate 200 in the bendable cover shown in FIG. 1.
Figure 2B:
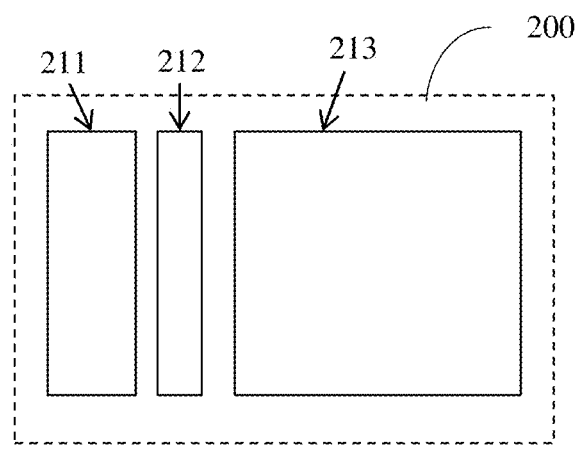
FIG. 2B is a top view of the flexible substrate 200 in the bendable cover shown in FIG. 1 after the upper surface of the flexible substrate 200 is truncated.

In another dimension, the bendable cover provided in this application includes a first hard part, a second hard part, and a first bending part. The first hard part and the second hard part each are in a shape of a slab. As shown in FIG. 1, FIG. 2A, and FIG. 2B, the first hard part includes a flexible substrate 211 corresponding to the first hard area, the first hard plate 101, and the first transparent bonding layer 103. The second hard part includes a flexible substrate 213 corresponding to the second hard area, the second hard plate 102, and the second transparent bonding layer 104. The first bending part is a flexible substrate 212 corresponding to the first bending area.

It should be noted that, it may be learned from FIG. 2B that "a flexible substrate 211 corresponding to the first hard area", "a flexible substrate 213 corresponding to the second hard area", and "a flexible substrate 212 corresponding to the first bending area" that are mentioned above each are a part of the flexible substrate 200. The flexible substrate 211 corresponding to the first hard area, the flexible substrate 213 corresponding to the second hard area, and the flexible substrate 212 corresponding to the first bending area each may be obtained by truncating the flexible substrate 200 along a thickness direction of the flexible substrate 200, and the truncation penetrates the flexible substrate 200 along the thickness direction of the flexible substrate 200. When the flexible substrate 200 includes only the flexible substrate 211 corresponding to the first hard area, the flexible substrate 213 corresponding to the second hard area, and the flexible substrate 212 corresponding to the first bending area, it should be understood that the flexible substrate 211 corresponding to the first hard area, the flexible substrate 213 corresponding to the second hard area, and the flexible substrate 212 corresponding to the first bending area can be spliced into the flexible substrate 200. It should be noted that, after the splicing is completed (or after the flexible substrate is obtained through splicing), the first hard area 201, the second hard area 203, and the first bending area 202 are located on a same planar surface. The planar surface is also a planar surface on which the upper surface of the flexible substrate 200 is located. Further, an upper surface of the flexible substrate 211 corresponding to the first hard area is the first hard area 201, an upper surface of the flexible substrate 213 corresponding to the second hard area is the second hard area 203, and an upper surface of the flexible substrate 212 corresponding to the first bending area is the first bending area 202.

It should be noted that the bending area in this application is an area that can be bent, or is a flexible area. "An area that can be bent" is an area that can be bent under an effect of external force, and can restore to an original shape after the external force is withdrawn. Correspondingly, the hard area in this application is an area that cannot be bent, that is, an area that encounters stress cracking after being bent under an effect of external force, and cannot restore to an original shape after the external force is withdrawn. It should be learned that, from the microscopic perspective, when enough small external force is applied, all substances can be deformed. Therefore, strictly, there is no object that cannot be bent absolutely. Therefore, the bending area and the hard area mentioned in this application should be understood from the perspective of a person skilled in the art.

It should be noted that "first", "second", "third", or the like in this application are merely used for mutual distinguishing. For example, "first" in the first hard area and "second" in the second hard area are used to indicate that the two hard areas are not a same hard area. Similarly, "first" in the first transparent bonding layer and "second" in the second transparent bonding layer are also used to indicate that the two transparent bonding layers are not a same transparent bonding layer.

It should be learned that, for the first bending area in this application, refer to the foregoing explanation about the bending area. For the first hard area and the second hard area in this application, refer to the foregoing explanation about the hard area. Therefore, details are not explained.

Figure 3A:
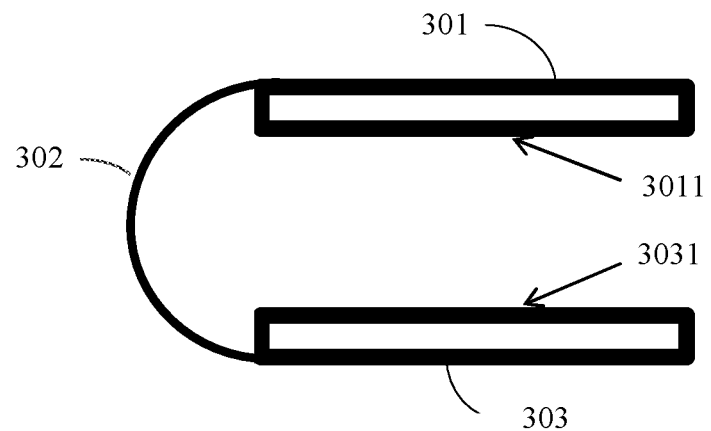
FIG. 3A is a side view of a bendable cover that is bent forward according to this application.
Figure 3B:
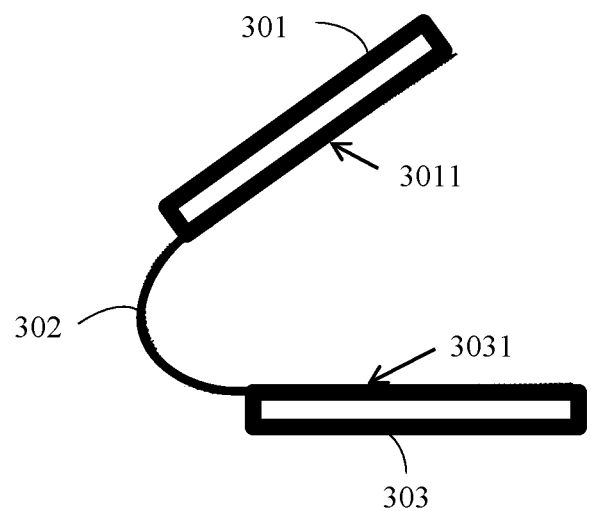
FIG. 3B is a side view of a bendable cover that is bent backward according to this application.

Further, in this application, as shown in FIG. 3A and FIG. 3B, when a first bending part 302 is bent, a minimum included angle between a planar surface on which an inner surface 3011 of the first hard part is located and a planar surface on which an inner surface 3031 of the second hard part is located is greater than or equal to 0 degrees and less than 180 degrees.

It should be learned that two pairs of opposite angles are formed after two straight lines intersect. Assuming that a value of a first pair of opposite angles is a, a value of a second pair of opposite angles is b, and a is less than b, a is a minimum included angle of the two straight lines. Because a cross section of two intersecting planar surfaces may be considered as two intersecting straight lines, a is also a minimum included angle between the two intersecting planar surfaces. It should be noted that the definition of the minimum included angle herein is applicable to any minimum included angle in this application. Therefore, when a minimum included angle appears subsequently, no definition is repeated.

Further, as shown in FIG. 3A and FIG. 3B, when the first bending part 302 is bent, the first hard part 301 and the second hard part 303 are approaching to each other. In this case, the inner surface 3011 of the first hard part faces the inner surface 3031 of the second hard part. "The inner surface 3011 of the first hard part faces the inner surface 3031 of the second hard part" may be understood as that the inner surface 3011 of the first hard part has a component on a first planar surface, and the first planar surface is parallel to the inner surface 3031 of the second hard part.

It should be noted that the bendable cover provided in this application can be bent in a bidirectional manner. It should be learned that any type of bending in the bidirectional bending is bending the bendable cover along a straight line perpendicular to a surface of a flexible substrate in the bendable cover.

It should be noted that, when the first bending part 302 is bent, the bendable cover is in a U-like shape or a shape similar to the U-like shape. In this case, an orientation of an opening for the U-like shape or the shape similar to the U-like shape is a bending direction of the bendable cover. Further, a structure including the first hard part 301, the first bending part 302, and the second hard part 303 may be referred to as a first structure. When the first bending part 302 is bent, the first structure is in a U-like shape or in a shape similar to the U-like shape, and correspondingly, an orientation of an opening for the U-like shape or the shape similar to the U-like shape is a bending direction of the first structure.

Optionally, the hard plate in this application may be 2.5D hard glass or 3D hard glass. It should be learned that the hard plate in this application may be the first hard plate or the second hard plate. Further, the hard plate may be a third hard plate in another embodiment of this application.

Optionally, both the first hard plate and the second hard plate in this application are made of high-hardness light transmissive materials. Further, the high-hardness light transmissive material may be glass (optionally, strengthened glass or a sapphire), PMMA, or the like. It should be noted that a hardness of the high-hardness light transmissive material is greater than or equal to 8H, where H is a pencil hardness.

Further, optionally, a material of which the first hard plate is made is the same as a material of which the second hard plate is made.

Further, optionally, a hardness of the first hard plate is the same as a hardness of the second hard plate.

Optionally, a thickness of the hard plate in this application is greater than or equal to 0.3 millimeters and less than or equal to 0.8 millimeters. Similarly, the hard plate in this application may be the first hard plate or the second hard plate. Further, the hard plate may be a third hard plate in another embodiment of this application.

Further, optionally, a thickness of the first hard plate is equal to a thickness of the second hard plate.

It should be noted that both the first transparent bonding layer and the second transparent bonding layer in this application are transparent and sticky. Further, a material of which the first transparent bonding layer is made may be an OCA, a UV adhesive, or the like. Correspondingly, a material of which the second transparent bonding layer is made may be an OCA, a UV adhesive, or the like. Optionally, the material of which the first transparent bonding layer is made is the same as the material of which the second transparent bonding layer is made.

Optionally, a thickness of the first transparent bonding layer is the same as a thickness of the second transparent bonding layer.

Optionally, both a light transmittance of the first transparent bonding layer and a light transmittance of the second transparent bonding layer are greater than or equal to 91%. Further, optionally, the light transmittance of the first transparent bonding layer is equal to the light transmittance of the second transparent bonding layer.

It should be noted that, in this application, a bending area of the flexible substrate can be bent, and a hard area of the flexible substrate cannot be bent. Therefore, when the bending area of the flexible substrate is bent, the hard area of the flexible substrate is still flat. The bending area may be the first bending area, or may be a second bending area in another subsequent embodiment. The hard area may be the first hard area or the second hard area, or may be a third hard area in another subsequent embodiment.

It should be noted that, in this application, a material of which the flexible substrate is made may be glass or plastic. When the material of which the flexible substrate is made is glass, the flexible substrate is a glass film. When the material of which the flexible substrate is made is plastic, the flexible substrate is a plastic film. When the flexible substrate is a plastic film, the flexible substrate may be a polyimide (PI) film, a polyethylene terephthalate (PET) film, a polycarbonate (PC) film, a polyethylene naphthalate (PEN) film, or a PMMA film.

Optionally, a thickness of the flexible substrate is greater than or equal to 0.07 millimeter and less than or equal to 0.15 millimeter.

Optionally, a hardness of the flexible substrate is greater than or equal to 8H.

Optionally, the thickness of the flexible substrate is even. That is, an upper surface of the flexible substrate is parallel to a lower surface of the flexible substrate.

It should be noted that the material of which the flexible substrate in this application is made is light transmissive. Optionally, a light transmittance of the flexible substrate is greater than or equal to 91%.

In an embodiment of this application, as shown in FIG. 3A, with reference to FIG. 1, when the first bending part 302 is bent, the inner surface 3011 of the first hard part is an upper surface of the first hard plate 101, the upper surface of the first hard plate 101 is opposite to a lower surface of the first hard plate 101, and the lower surface of the first hard plate 101 is bonded to the first hard area 201 using the first transparent bonding layer 103. Similarly, the inner surface 3031 of the second hard part is an upper surface of the second hard plate 102, the upper surface of the second hard plate 102 is opposite to a lower surface of the second hard plate 102, and the lower surface of the second hard plate 102 is bonded to the second hard area 203 using the second transparent bonding layer 104. It should be noted that, for ease of description, the bending in this embodiment is referred to as forward bending subsequently.

As mentioned above, after the first bending part is bent, the first structure is in a U-like shape or in a shape similar to the U-like shape. Further, after the first bending part is bent forward, the inner surface 3011 of the first hard part and the inner surface 3031 of the second hard part each are a part of an inner surface of the structure in a U-like shape or in a shape similar to the U-like shape. It should be further learned that, after the first bending part is bent forward, both the first hard plate 101 and the second hard plate 102 are located inside the structure in a U-like shape or in a shape similar to the U-like shape.

Optionally, in this embodiment, selection of a minimum curvature radius of the first bending part 302 is limited by the thickness of the first hard plate 101 and the thickness of the second hard plate 102. Further, when the first bending part 302 is bent forward, the minimum curvature radius of the first bending part 302 can enable the inner surface 3011 of the first hard part to be fitted to the inner surface 3031 of the second hard part.

In another embodiment of this application, as shown in FIG. 3B, with reference to FIG. 1 and FIG. 2B, when the first bending part 302 is bent, the inner surface 3011 of the first hard part is a lower surface of the flexible substrate 211 corresponding to the first hard area, and the lower surface of the flexible substrate 211 corresponding to the first hard area is opposite to the first hard area 201. Similarly, the inner surface 3031 of the second hard part is a lower surface of the flexible substrate 213 corresponding to the second hard area, and the lower surface of the flexible substrate 213 corresponding to the second hard area is opposite to the second hard area 203. For ease of description, the bending in this embodiment is referred to as backward bending subsequently.

As mentioned above, after the first bending part 302 is bent, the first structure is in a U-like shape or in a shape similar to the U-like shape. Similarly, after the first bending part 302 is bent backward, the inner surface 3011 of the first hard part and the inner surface 3031 of the second hard part each are a part of an inner surface of the structure in a U-like shape or in a shape similar to the U-like shape. It should be further learned that, after the first bending part 302 is bent backward, both the first hard plate 101 and the second hard plate 102 are located outside the structure in a U-like shape or in a shape similar to the U-like shape.

Optionally, when the first bending part 302 is bent (regardless of whether the first bending part is bent forward or backward), along a thickness direction of the second hard part 303, a projection of the first hard part 301 on the planar surface on which the inner surface 3031 of the second hard part is located is located inside the inner surface 3031 of the second hard part.

It should be noted that a curvature radius of the first bending part 302 when the first bending part 302 is bent forward is usually different from a curvature radius of the first bending part 302 when the first bending part 302 is bent backward.

In an embodiment of this application, as shown in FIG. 2A, a width of the first bending area 202 is greater than or equal to $\pi R$, and R is a minimum curvature radius of the first bending area 202. It should be learned that the curvature radius is a reciprocal of a curvature. A larger curvature of the first bending area 202 indicates a larger degree at which the first bending area 202 can be bent.

As shown in FIG. 2A, as mentioned above, the first hard area 201 and the second hard area 203 each are adjacent to the first bending area 202. Further, in this embodiment, a boundary between the first hard area 201 and the first bending area 202 is a straight line, a boundary between the second hard area 203 and the first bending area 202 is also a straight line, and the two boundaries are parallel to each other. It should be learned that a distance between the two boundaries is the width of the first bending area 202.

It should be learned that, in this application, the first hard area 201 and the second hard area 203 are separated by the first bending area 202. The separation means that there is no overlapping area between the first hard area 201 and the second hard area 203. For details about subsequent separation, refer to the explanation herein.

Optionally, in this embodiment, the width of the first bending area 202 is at a millimeter scale. Further, optionally, a curvature radius of the first bending area 202 is greater than or equal to 4.7 millimeters.

In another embodiment of this application, as shown in FIG. 2A, edges of the first hard area 201 may include an inner edge 2011 and an outer edge 2012. The inner edge 2011 of the first hard area is a boundary between the first hard area 201 and the first bending area 202, and correspondingly, the other edge in the edges of the first hard area 201 than the inner edge 2011 is the outer edge 2012 of the first hard area. Referring to FIG. 2A, it is easily learned that the outer edge 2012 of the first hard area overlaps a part of an edge of an upper surface of the flexible substrate 200.

Figure 4A:
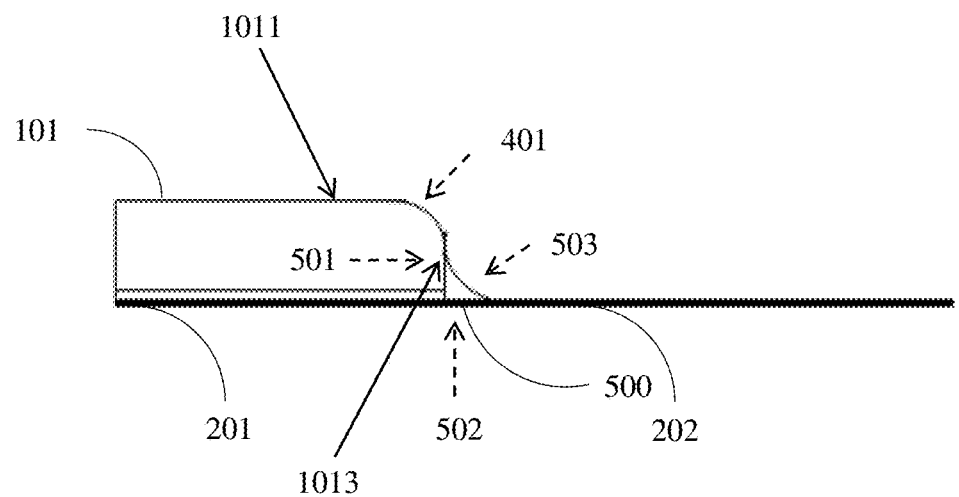
FIG. 4A is a partial structural diagram of the bendable cover shown in FIG. 1.
Figure 4B:
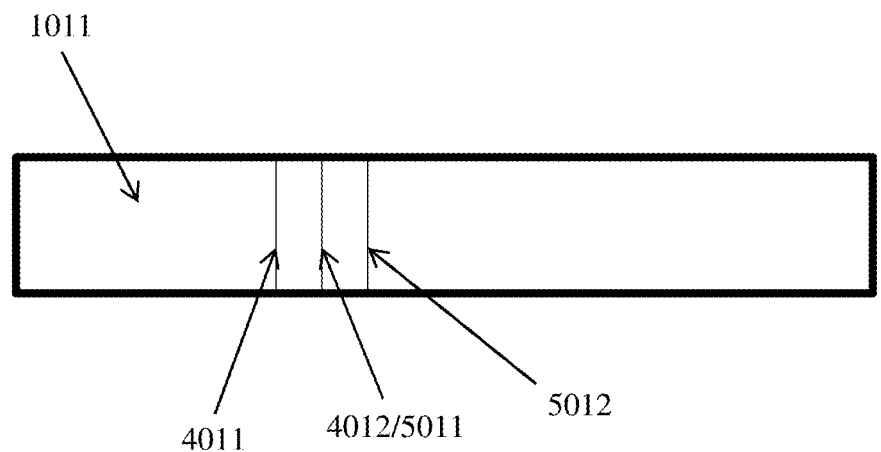
FIG. 4B is a top view of the partial structural diagram shown in FIG. 4A.

In an embodiment of this application, as shown in FIG. 4A, the first hard plate 101 further has a first curved surface 401, and the first curved surface 401 is a convex surface. In addition, the first curved surface 401 is located between an upper surface 1011 of the first hard plate and an inner wall 1013 of the first hard plate. FIG. 4B is a top view of FIG. 4A. The first curved surface 401 has a first edge 4011 and a second edge 4012 that are opposite to each other. Further, the first edge 4011 of the first curved surface is an intersecting line between the first curved surface 401 and the upper surface 1011 of the first hard plate, and the second edge 4012 of the first curved surface is an intersecting line between the first curved surface 401 and the inner wall 1013 of the first hard plate. It should be noted that the first curved surface 401 is of G2 continuity from the first edge 4011 of the first curved surface to the second edge 4012 of the first curved surface.

It should be noted that the upper surface 1011 of the first hard plate is opposite to a lower surface of the first hard plate 101. As shown in FIG. 1, the lower surface of the first hard plate 101 faces the first hard area 201. Further, the lower surface of the first hard plate 101 is bonded to the first hard area 201 using the first transparent bonding layer 103. It should be further noted that, with reference to FIG. 1 and FIG. 4A, it can be learned that the inner wall 1013 of the first hard plate faces a side wall of the second hard plate 102.

It should be noted that, with reference to FIG. 1 and FIG. 4A, it can be learned that the first edge 4011 of the first curved surface overlaps an inner edge of the upper surface 1011 of the first hard plate. A minimum distance from a center point of the inner edge of the upper surface 1011 of the first hard plate to the first bending area 202 is shorter than a minimum distance from a center point of each of other edges of the upper surface 1011 of the first hard plate to the first bending area 202. It should be further learned that, along a thickness direction of the first hard plate 101, a projection of the inner edge of the upper surface 1011 of the first hard plate on a planar surface on which the upper surface of the flexible substrate 200 is located is located inside the upper surface of the flexible substrate 200.

It should be further noted that the second edge 4012 of the first curved surface overlaps an upper edge of the inner wall 1013 of the first hard plate. It should be noted that the inner wall 1013 of the first hard plate has the upper edge and a lower edge that are opposite to each other. A distance from the lower edge of the inner wall 1013 of the first hard plate to the upper surface of the flexible substrate 200 is shorter than a distance from the upper edge of the inner wall 1013 of the first hard plate and the upper surface of the flexible substrate 200.

It should be noted that "the first curved surface 401 is of G2 continuity from the first edge 4011 of the first curved surface to the second edge 4012 of the first curved surface" means that the first curved surface 401 is smoothly transitted from the first edge 4011 of the first curved surface to the second edge 4012 of the first curved surface, that is, there is no inflection point or a sharp point on the first curved surface 401.

Optionally, as shown in FIG. 4A, a curvature of the first curved surface 401 is of G2 continuity from the first edge 4011 of the first curved surface to the second edge 4012 of the first curved surface. It should be learned that, when the curvature of the first curved surface 401 is of G2 continuity, the first curved surface 401 is smoothly transitted.

It should be noted that, as shown in FIG. 4A, the first curved surface 401 located on the first hard plate 101 may be obtained after rounding processing is performed on the first hard plate 101.

Optionally, as shown in FIG. 4B, the first edge 4011 of the first curved surface is parallel to the second edge 4012 of the first curved surface.

Further, as shown in FIG. 4A and FIG. 4B, the first edge 4011 of the first curved surface is parallel to the boundary between the first hard area 201 and the first bending area 202.

Further, as shown in FIG. 4A and FIG. 4B, an included angle area between the inner wall 1013 of the first hard plate and the first bending area 202 has a first gel 500. The first gel 500 has a side wall 501, a lower surface 502, and a second curved surface 503. An intersecting line between the side wall 501 and the second curved surface 503 is a first edge 5011 of the second curved surface, and an intersecting line between the lower surface 502 and the second curved surface 503 is a second edge 5012 of the second curved surface. It should be noted that the first edge 5011 of the second curved surface is opposite to the second edge 5012 of the second curved surface.

It should be noted that, as shown in FIG. 4A, the lower surface 502 of the first gel is fitted to the first bending area 202. Further, the side wall 501 of the first gel is fitted to the inner wall 1013 of the first hard plate. As described above, with reference to FIG. 1, the first hard plate 101 is fitted to the first hard area 201 using the first transparent bonding layer 103. Optionally, along the thickness direction of the first hard plate 101, a projection of the first hard plate 101 on the upper surface of the flexible substrate 200 completely overlaps a projection of the first transparent bonding layer 103 on the upper surface of the flexible substrate 200. In this case, a large part of the side wall 501 of the first gel is fitted to the inner wall 1013 of the first hard plate, and a small part of the side wall 501 is fitted to an inner wall of the first transparent bonding layer 103 (refer to FIG. 4A). It should be learned that the inner wall of the first transparent bonding layer 103 also faces a side wall of the second hard plate 102, and the inner wall of the first transparent bonding layer 103 and the inner wall 1013 of the first hard plate face a same side wall of the second hard plate 102.

It should be noted that the second curved surface 503 is a concave surface, and the second curved surface 503 is of G2 continuity from the first edge 5011 of the second curved surface to the second edge 5012 of the second curved surface. For "the second curved surface 503 is of G2 continuity from the first edge 5011 of the second curved surface to the second edge 5012 of the second curved surface", refer to the foregoing explanation about "the first curved surface 401 is of G2 continuity from the first edge 4011 of the first curved surface to the second edge 4012 of the first curved surface". Details are not described herein again.

Optionally, a curvature of the second curved surface 503 is of G2 continuity from the first edge 5011 of the second curved surface to the second edge 5012 of the second curved surface. It should be learned that, when the curvature of the second curved surface 503 is of G2 continuity, the second curved surface 503 is smoothly transitted.

It should be noted that, in this embodiment, the first edge 5011 of the second curved surface overlaps the second edge 4012 of the first curved surface (for details, refer to FIG. 4B).

Optionally, the first curved surface 401 and the second curved surface 503 form a continuous curved surface, and the continuous curved surface is of G2 continuity from the first edge 4011 of the first curved surface to the second edge 5012 of the second curved surface. For "the continuous curved surface is of G2 continuity from the first edge 4011 of the first curved surface to the second edge 5012 of the second curved surface", refer to the foregoing explanation about "the first curved surface 401 is of G2 continuity from the first edge 4011 of the first curved surface to the second edge 4012 of the first curved surface". Details are not described herein again.

Further, optionally, a curvature of the continuous curved surface is of G2 continuity from the first edge 4011 of the first curved surface to the second edge 5012 of the second curved surface. It should be learned that, when the curvature of the continuous curved surface is of G2 continuity, the continuous curved surface is smoothly transitted.

It should be noted that, in this embodiment, the first gel 500 is light transmissive. Further, the first gel 500 may be an OCA or a UV adhesive.

It should be noted that, in this embodiment, the reason why the first gel 500 needs to be filled in the included angle area between the inner wall 1013 of the first hard plate and the first bending area 202 is that before the first gel 500 is filled, there is a segment difference between the inner wall 1013 of the first hard plate and the first bending area 202, and consequently smooth transition from the inner wall 1013 of the first hard plate to the first bending area 202 cannot be implemented.

It should be learned that a method used to fill the first gel 500 is not limited in this embodiment, and any method that can be used to fill the first gel 500 in the included angle area between the inner wall 1013 of the first hard plate and the first bending area 202 may be used in this embodiment. Further, a liquid OCA may be first filled using a mode, and then the liquid OCA is fastened to fill the first gel 500. Alternatively, the first gel 500 may be filled by applying a transparent silicone gel or the like to the included angle area between the inner wall 1013 of the first hard plate and the first bending area 202.

Optionally, along a thickness direction of the flexible substrate 200, a maximum thickness of the first gel 500 is greater than or equal to 0.2 millimeter and less than or equal to the thickness of the first hard plate 101. It should be learned that the maximum thickness of the first gel 500 is equal to a minimum distance from the upper edge of the inner wall 1013 of the first hard plate to the first bending area 202.

Figure 5A:
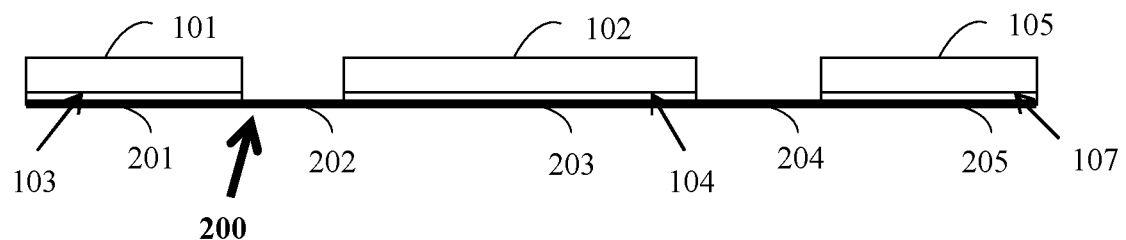
FIG. 5A and FIG. 5B each are a side view of another bendable cover according to this application.

In another embodiment of this application, as shown in FIG. 5A, the bendable cover further includes a third hard plate 105, and correspondingly, the upper surface of the flexible substrate 200 further includes a third hard area 205 and a second bending area 204 located between the third hard area 205 and the second hard area 203. The third hard area 205 and the second hard area 203 each are adjacent to the second bending area 204. It should be noted that the third hard plate 105 is bonded to the third hard area 205 using a third transparent bonding layer 107.

Optionally, along a thickness direction of the third hard plate 105, a projection of the third hard plate 105 on a planar surface on which the third hard area 205 is located completely overlaps the third hard area 205. Optionally, the first hard area 201 and the third hard area 205 are symmetrically distributed. Correspondingly, the first hard plate 101 and the third hard plate 105 are also symmetrically distributed on the upper surface of the flexible substrate 200.

Figure 5B:
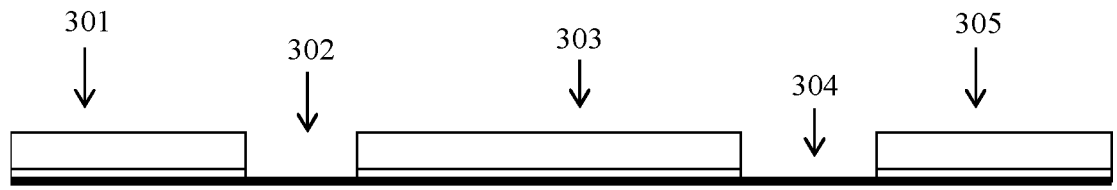

In another dimension, as shown in FIG. 5B, the bendable cover provided in this embodiment includes a second bending part 304 and a third hard part 305. The second bending part 304 is a flexible substrate corresponding to the second bending area 204. It should be further noted that the third hard part 305 is in a shape of a slab. Further, the third hard part 305 includes a flexible substrate corresponding to the third hard area 205, the third hard plate 105, and the third transparent bonding layer 107.

It should be noted that the flexible substrate corresponding to the second bending area 204 and the flexible substrate corresponding to the third hard area 205 each are a part of the flexible substrate 200, and may be obtained by truncating the flexible substrate 200 along the thickness direction of the flexible substrate 200. The truncation penetrates the flexible substrate 200 along the thickness direction of the flexible substrate 200. It is assumed that the flexible substrate 200 includes only the flexible substrate corresponding to the second bending area 204 and the flexible substrate corresponding to the third hard area 205. It should be understood that the flexible substrate corresponding to the second bending area 204 and the flexible substrate corresponding to the third hard area 205 can be spliced into the flexible substrate 200. It should be noted that, after the splicing is completed (or after the flexible substrate is obtained through splicing), the second bending area 204 and the third hard area 205 are located on a same planar surface. The planar surface is also a planar surface on which the upper surface of the flexible substrate 200 is located. It should be learned that an upper surface of the flexible substrate corresponding to the second bending area 204 is the second bending area 204. Similarly, an upper surface of the flexible substrate corresponding to the third hard area 205 is the third hard area 205.

It should be noted that, for the second bending area 204 in this embodiment, refer to the foregoing explanation about the bending area. For the third hard area 205 in this embodiment, refer to the foregoing explanation about the hard area. Details are not described herein again.

Figure 6A:
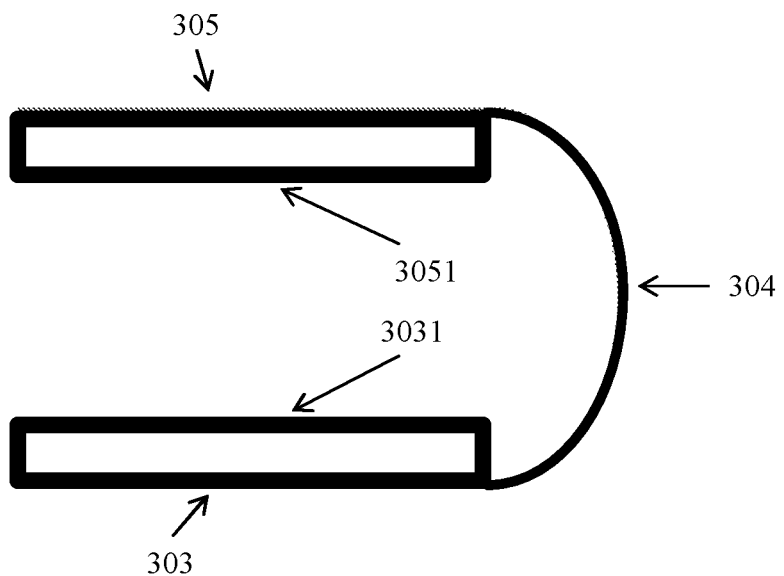
FIG. 6A is a side view obtained after a local structure of the bendable cover shown in FIG. 5A
Figure 6B:
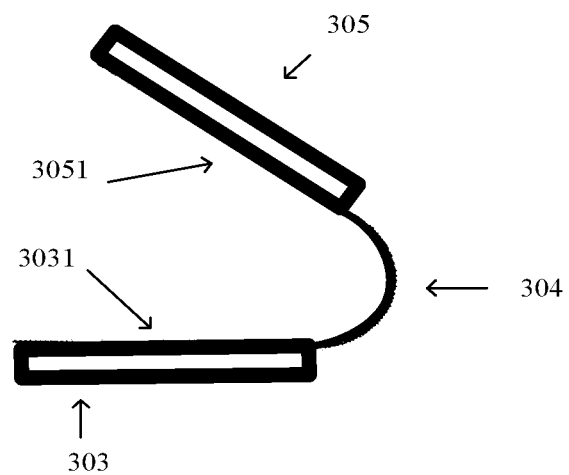
FIG. 6B is a side view obtained after a local structure of the bendable cover shown in FIG. 5A

As shown in FIG. 6A and FIG. 6B, when the second bending part 304 is bent, a minimum included angle between a planar surface on which an inner surface 3051 of the third hard part is located and the planar surface on which an inner surface 3031 of the second hard part is located is greater than or equal to 0 degrees and less than 180 degrees. It should be noted that, when the second bending part 304 is bent, the inner surface 3051 of the third hard part faces the inner surface 3031 of the second hard part. "The inner surface 3051 of the third hard part faces the inner surface 3031 of the second hard part" may be understood as that the inner surface 3051 of the third hard part has a component on the first planar surface. As described above, the first planar surface is parallel to the inner surface 3031 of the second hard part.

It should be noted that the second bending part 304 in this embodiment can also be bent in a bidirectional manner. In this embodiment, a structure including the third hard part 305, the second bending part 304, and the second hard part 303 may be referred to as a second structure. When the second bending part 304 is bent, the second structure is in a U-like shape or in a shape similar to the U-like shape. An orientation of an opening for the U-like shape or the shape similar to the U-like shape is a bending direction of the second structure.

Optionally, as shown in FIG. 5A, the third hard plate 105 is 2.5D hard glass or 3D hard glass.

Optionally, as shown in FIG. 5A, a material of which the third hard plate 105 is made is a high-hardness light transmissive material. For a feature of the high-hardness light transmissive material, refer to the foregoing related limitation. Details are not described herein again.

Optionally, as shown in FIG. 5A, the material of which the third hard plate 105 is made is the same as the material of which the second hard plate 102 is made. Further, optionally, the material of which the first hard plate 101 is made, the material of which the second hard plate 102 is made, and the material of which the third hard plate 105 is made are the same.

Optionally, as shown in FIG. 5A, a hardness of the third hard plate 105 is the same as a hardness of the second hard plate 102. Further, optionally, the hardness of the first hard plate 101, the hardness of the second hard plate 102, and the hardness of the third hard plate 105 are the same.

Optionally, as shown in FIG. 5A, a thickness of the third hard plate 105 is the same as the thickness of the second hard plate 102. Further, optionally, the thickness of the first hard plate 101, the thickness of the second hard plate 102, and the thickness of the third hard plate 105 are the same.

It should be noted that, as shown in FIG. 5A, the third transparent bonding layer 107 in this embodiment is transparent and sticky. Further, a material of which the third transparent bonding layer 107 is made may be an OCA or a UV adhesive. Optionally, the material of which the third transparent bonding layer 107 is made is the same as the material of which the second transparent bonding layer 104 is made. Further, optionally, the material of which the first transparent bonding layer 103 is made, the material of which the second transparent bonding layer 104 is made, and the material of which the third transparent bonding layer 107 is made are the same.

Optionally, as shown in FIG. 5A, the thickness of the third transparent bonding layer 107 is the same as the thickness of the second transparent bonding layer 104. Further, optionally, the thickness of the first transparent bonding layer 103, the thickness of the second transparent bonding layer 104, and the thickness of the third transparent bonding layer 107 are the same.

Optionally, as shown in FIG. 5A, a light transmittance of the third transparent bonding layer 107 is greater than or equal to 91%. Further, optionally, the light transmittance of the third transparent bonding layer 107 is equal to the light transmittance of the second transparent bonding layer 104. Alternatively, the light transmittance of the first transparent bonding layer 103, the light transmittance of the second transparent bonding layer 104, and the light transmittance of the third transparent bonding layer 107 are the same.

Similar to the foregoing embodiment, in this embodiment, the second bending part 304 may also be bent forward or backward.

In a specific implementation of this embodiment, referring to FIG. 6A, with reference to FIG. 5A, when the second bending part 304 is bent forward, the inner surface 3051 of the third hard part is an upper surface of the third hard plate 105, the upper surface of the third hard plate 105 is opposite to a lower surface of the third hard plate 105, and the lower surface of the third hard plate 105 is bonded to the third hard area 205 using the third transparent bonding layer 107. It should be further noted that the inner surface 3031 of the second hard part is the upper surface of the second hard plate 102. It should be noted that, for "the upper surface of the second hard plate 102", refer to the explanation in the foregoing embodiment. Details are not described herein again.

As mentioned above, after the second bending part 304 is bent, the second structure is the structure in a U-like shape or in a shape similar to the U-like shape. Further, after the second bending part 304 is bent forward, the inner surface 3051 of the third hard part and the inner surface 3031 of the second hard part each are a part of an inner surface of the structure in a U-like shape or in a shape similar to the U-like shape. That is, after the second bending part 304 is bent forward, both the third hard plate 105 and the second hard plate 102 are located inside the structure in a U-like shape or in a shape similar to the U-like shape.

Optionally, selection of a minimum curvature radius of the second bending part 304 is limited by the thickness of the third hard plate 105 and the thickness of the second hard plate 102. Further, when the second bending part 304 is bent forward, the minimum curvature radius of the second bending part 304 can enable the inner surface 3051 of the third hard part to be fitted to the inner surface 3031 of the second hard part.

In another specific implementation of this embodiment, referring to FIG. 6B, with reference to FIG. 5A, when the second bending part 304 is bent backward, the inner surface 3051 of the third hard part is a lower surface of the flexible substrate corresponding to the third hard area 205, and the inner surface 3031 of the second hard part is the lower surface of the flexible substrate corresponding to the second hard area 203. The lower surface of the flexible substrate corresponding to the third hard area 205 is opposite to the third hard area 205, and the lower surface of the flexible substrate corresponding to the second hard area 203 is opposite to the second hard area 203.

As mentioned above, after the second bending part 304 is bent, the second structure is the structure in a U-like shape or in a shape similar to the U-like shape. It should be noted that, after the second bending part 304 is bent backward, the inner surface 3051 of the third hard part and the inner surface 3031 of the second hard part each are a part of the inner surface of the structure in a U-like shape or in a shape similar to the U-like shape. It should be learned that, after the second bending part 304 is bent backward, both the third hard plate 105 and the second hard plate 102 are located outside the structure in a U-like shape or in a shape similar to the U-like shape.

Optionally, when the second bending part 304 is bent (regardless of whether the second bending part is bent forward or backward), along a thickness direction of the second hard part 303, a projection of the third hard part 305 on the planar surface on which the inner surface 3031 of the second hard part is located is located inside the inner surface 3031 of the second hard part.

Optionally, referring to FIG. 5B, when the first bending part 302 is bent forward, the second bending part 304 is also bent forward. Alternatively, when the first bending part 302 is bent backward, the second bending part 304 is also bent backward.

Optionally, when both the first bending part 302 and the second bending part 304 are bent, along the thickness direction of the second hard part 303, both the projection of the first hard part 301 on the planar surface on which the inner surface 3031 of the second hard part is located and the projection of the third hard part 305 on the planar surface on which the inner surface 3031 of the second hard part is located are located inside the inner surface 3031 of the second hard part, and the two projections are separated from each other.

It should be noted that a curvature radius of the second bending part 304 when the second bending part 304 is bent forward is usually different from a curvature radius of the second bending part 304 when the second bending part 304 is bent backward.

Optionally, as shown in FIG. 5A, a width of the second bending area 204 is greater than or equal to $\pi R$, and R is a minimum curvature radius of the second bending area 204. As mentioned above, the second hard area 203 and the third hard area 205 each are adjacent to the second bending area 204. In this embodiment, a boundary between the second hard area 203 and the second bending area 204 is a straight line, a boundary between the third hard area 205 and the second bending area 204 is also a straight line, the two boundaries are parallel to each other, and a distance between the two boundaries is the width of the second bending area 204. It is easily learned that, in this embodiment, the second hard area 203 and the third hard area 205 are separated by the second bending area 204.

Optionally, in this embodiment, the width of the second bending area 204 is at a millimeter scale. Further, optionally, a curvature radius of the second bending area 204 is greater than or equal to 4.7 millimeters.

Figure 7:
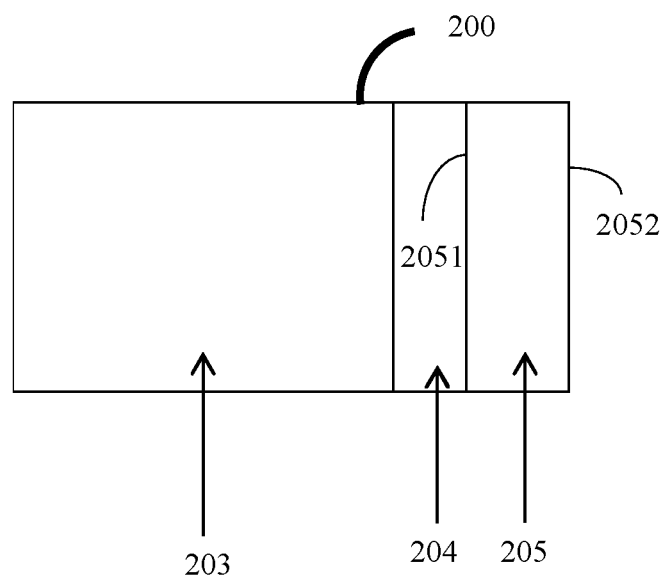
FIG. 7 is a partial top view of an upper surface of a flexible substrate 200 in the bendable cover shown in FIG. 5A.

In still another embodiment of this application, referring to FIG. 7, edges of the third hard area 205 may include an inner edge 2051 and an outer edge 2052. The inner edge 2051 of the third hard area is the boundary between the third hard area 205 and the second bending area 204, and correspondingly, the other edge in the edges of the third hard area 205 than the inner edge 2051 is the outer edge 2052 of the third hard area. It should be noted that the outer edge 2052 of the third hard area overlaps a part of an edge of the upper surface of the flexible substrate 200.

Figure 8A:
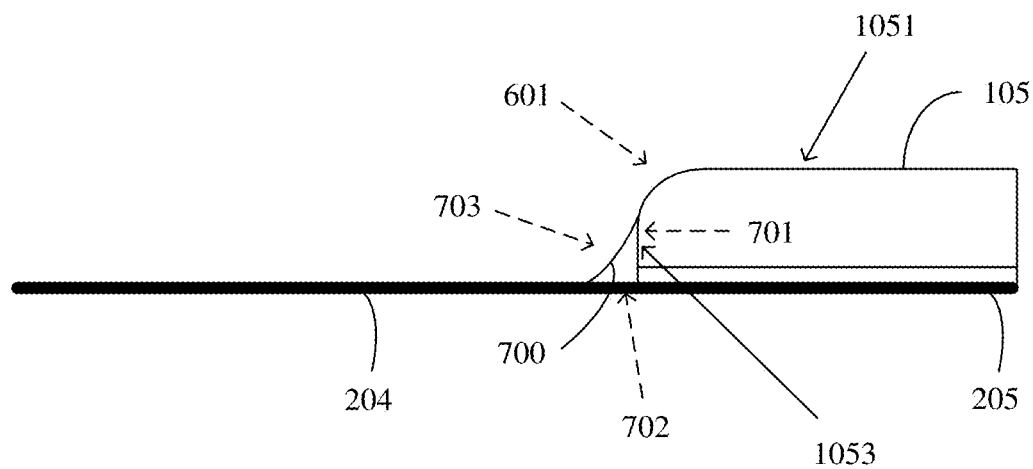
FIG. 8A is a side view of a local structure of the bendable cover shown in FIG. 5A.
Figure 8B:
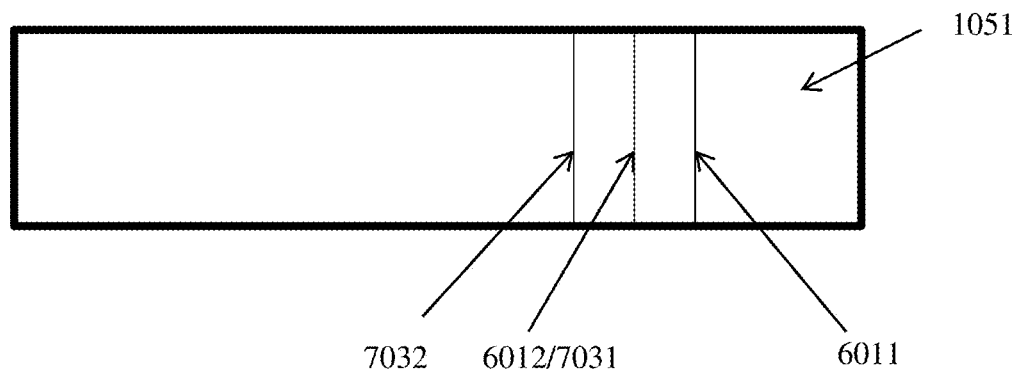
FIG. 8B is a top view of the local structure of the bendable cover shown in FIG. 8A.

In still another specific implementation of this embodiment, as shown in FIG. 8A, the third hard plate 105 further has a third curved surface 601, and the third curved surface 601 is a convex surface. In addition, the third curved surface 601 is located between an upper surface 1051 of the third hard plate and an inner wall 1053 of the third hard plate. Referring to FIG. 8B, it is easily learned that the third curved surface 601 has a first edge 6011 and a second edge 6012 that are opposite to each other. Further, the first edge 6011 of the third curved surface is an intersecting line between the third curved surface 601 and the upper surface 1051 of the third hard plate, and the second edge 6012 of the third curved surface is an intersecting line between the third curved surface 601 and the inner wall 1053 of the third hard plate. It should be noted that the third curved surface 601 is of G2 continuity from the first edge 6011 of the third curved surface to the second edge 6012 of the third curved surface.

It should be noted that the upper surface 1051 of the third hard plate is opposite to the lower surface of the third hard plate 105, and the lower surface of the third hard plate 105 faces the third hard area 205. Further, as shown in FIG. 5A, the lower surface of the third hard plate 105 is bonded to the third hard area 205 using the third transparent bonding layer 107. It should be further noted that the inner wall 1053 of the third hard plate faces a side wall of the second hard plate 102. It should be learned that the inner wall 1013 of the first hard plate in the foregoing embodiment and the inner wall 1053 of the third hard plate in this embodiment respectively face different side walls of the second hard plate 102.

It should be noted that, for "the third curved surface 601 is of G2 continuity from the first edge 6011 of the third curved surface to the second edge 6012 of the third curved surface", refer to the foregoing explanation about "the first curved surface 401 is of G2 continuity from the first edge 4011 of the first curved surface to the second edge 4012 of the first curved surface". Details are not described herein again.

Optionally, a curvature of the third curved surface 601 is of G2 continuity from the first edge 6011 of the third curved surface to the second edge 6012 of the third curved surface. It should be learned that, when the curvature of the third curved surface 601 is of G2 continuity, the third curved surface 601 is smoothly transitted.

It should be noted that the third curved surface 601 located on the third hard plate 105 may be obtained after rounding processing is performed on the third hard plate 105.

Optionally, as shown in FIG. 8B, the first edge 6011 of the third curved surface is parallel to the second edge 6012 of the third curved surface.

Optionally, as shown in FIG. 8A and FIG. 8B, the first edge 6011 of the third curved surface is parallel to the boundary between the third hard area 205 and the second bending area 204.

Further, as shown in FIG. 8A, an included angle area between the inner wall 1053 of the third hard plate and the second bending area 204 has a second gel 700. The second gel 700 has a side wall 701, a lower surface 702, and a fourth curved surface 703. Referring to FIG. 8B, an intersecting line between the side wall 701 and the fourth curved surface 703 is a first edge 7031 of the fourth curved surface, and an intersecting line between the lower surface 702 and the fourth curved surface 703 is a second edge 7032 of the fourth curved surface. It should be noted that the first edge 7031 of the fourth curved surface is opposite to the second edge 7032 of the fourth curved surface.

It should be noted that, as shown in FIG. 8A, the lower surface 702 of the second gel is fitted to the second bending area 204. Further, the side wall 701 of the second gel is fitted to the inner wall 1053 of the third hard plate. As described above, with reference to FIG. 5A, the third hard plate 105 is fitted to the third hard area 205 using the third transparent bonding layer 107. Optionally, along the thickness direction of the third hard plate 105, a projection of the third hard plate 105 on the upper surface of the flexible substrate 200 completely overlaps a projection of the third transparent bonding layer 107 on the upper surface of the flexible substrate 200. In this case, a large part of the side wall 701 of the second gel is fitted to the inner wall 1053 of the third hard plate, and a small part of the side wall 701 is fitted to an inner wall of the third transparent bonding layer 107. As shown in FIG. 5A, it should be learned that the inner wall of the third transparent bonding layer 107 also faces a side wall of the second hard plate 102, and the inner wall of the third transparent bonding layer 107 and the inner wall 1053 of the third hard plate face a same side wall of the second hard plate 102.

It should be noted that, as shown in FIG. 8A, the fourth curved surface 703 is a concave surface, and the fourth curved surface 703 is of G2 continuity from the first edge 7031 of the fourth curved surface to the second edge 7032 of the fourth curved surface. For "the fourth curved surface 703 is of G2 continuity from the first edge 7031 of the fourth curved surface to the second edge 7032 of the fourth curved surface", refer to the foregoing explanation about "the first curved surface 401 is of G2 continuity from the first edge 4011 of the first curved surface to the second edge 4012 of the first curved surface". Details are not described herein again.

Optionally, a curvature of the fourth curved surface 703 is of G2 continuity from the first edge 7031 of the fourth curved surface to the second edge 7032 of the fourth curved surface. It should be learned that, when the curvature of the fourth curved surface 703 is of G2 continuity, the fourth curved surface 703 is smoothly transitted.

It should be noted that, in this embodiment, the first edge 7031 of the fourth curved surface overlaps the second edge 6012 of the third curved surface (as shown in FIG. 8B).

Optionally, the third curved surface 601 and the fourth curved surface 703 form a continuous curved surface, and the continuous curved surface is of G2 continuity from the first edge 6011 of the third curved surface to the second edge 7032 of the fourth curved surface. For "the continuous curved surface is of G2 continuity from the first edge 6011 of the third curved surface to the second edge 7032 of the fourth curved surface", refer to the foregoing explanation about "the first curved surface 401 is of G2 continuity from the first edge 4011 of the first curved surface to the second edge 4012 of the first curved surface". Details are not described herein again.

Further, optionally, a curvature of the continuous curved surface is of G2 continuity from the first edge 6011 of the third curved surface to the second edge 7032 of the fourth curved surface. It should be learned that, when the curvature of the continuous curved surface is of G2 continuity, the continuous curved surface is smoothly transitted.

It should be noted that, in this embodiment, the second gel 700 is light transmissive. Further, the first gel 700 may be an OCA or a UV adhesive.

It should be noted that, in this embodiment, the reason why the second gel 700 needs to be filled in the included angle area between the inner wall 1053 of the third hard plate and the second bending area 204 is that before the second gel 700 is filled, there is a segment difference between the inner wall 1053 of the third hard plate and the second bending area 204, and consequently smooth transition from the inner wall 1053 of the third hard plate to the second bending area 204 cannot be implemented.

Optionally, along the thickness direction of the flexible substrate 200, a maximum thickness of the second gel 700 is greater than or equal to 0.2 millimeter and less than or equal to the thickness of the third hard plate 105. It should be learned that the maximum thickness of the second gel 700 is equal to a minimum distance from the upper edge of the inner wall 1053 of the third hard plate to the second bending area 204. In an embodiment of this application, the first hard plate 101, the second hard plate 102, or the third hard plate 105 may be formed by splicing a plurality of hard subplates. It should be learned that the hard subplate should meet the foregoing limitation on the hard plate.

In another embodiment of this application, the flexible substrate 200 may be formed by splicing a plurality of flexible sub-substrates. It should be learned that a joint part of two adjacent flexible sub-substrates should be located in a hard area. The hard area may be the first hard area 201, the second hard area 203, or the third hard area 205.

Bendable Display Module

Figure 9:
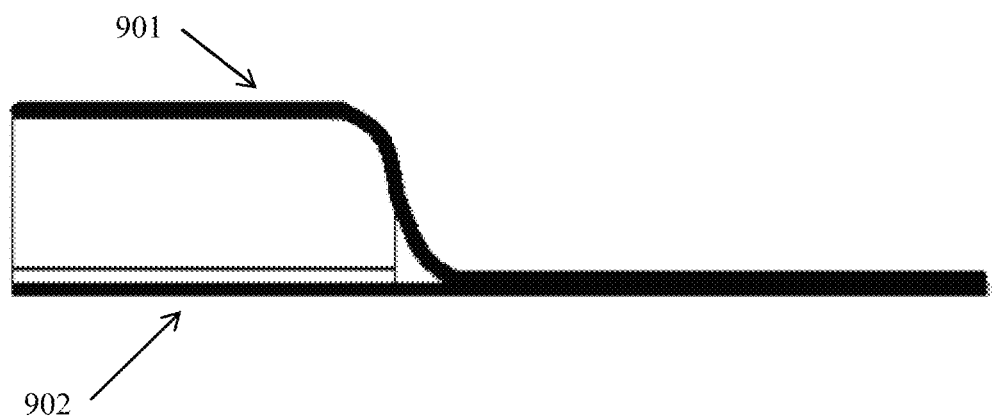
FIG. 9 is a side view of a bendable display module according to this application.

FIG. 9 shows a bendable display module according to this application. It should be learned that the bendable display module may be applied to a terminal device. Further, the bendable display module includes a display screen 901 and the bendable cover 902 in any one of the foregoing embodiments. The bendable cover 902 covers an outer surface of the display screen 901.

It should be noted that the outer surface of the display screen is a surface that can display an image. Correspondingly, an inner surface of the display screen is a surface used to receive a signal corresponding to the image. It should be learned that the outer surface of the display screen is opposite to the inner surface of the display screen.

Optionally, the display screen is a touch display screen. It should be noted that the touch display screen includes a display screen and a touch layer. Further, the touch layer may be embedded inside the display screen, or may be fitted to a surface of the display screen. When the touch layer is fitted to the surface of the display screen, the touch layer and the display screen are stacked.

It should be learned that the touch layer is configured to implement a touch function. Commonly, the touch function is implemented using a flexible printed circuit (FPC) board and a touch chip. It should be further learned that the display screen in this application is a liquid crystal light-emitting component. The display screen may be an organic light-emitting diode (OLED) display screen, a liquid-crystal display (LCD), or the like. Further, the OLED display screen may be an active-matrix OLED (AMOLED) display screen, or may be a passive-matrix OLED (PMOLED) display screen.

It should be further noted that the display screen 901 in this application can be bent and can be bent in a bidirectional manner. It should be learned that the display screen 901 has a minimum curvature radius. Optionally, regardless of whether the bendable display module is bent forward or backward, the minimum curvature radius of the display screen 901 is less than or equal to a minimum curvature radius of the bendable cover 902. In this case, the minimum curvature radius of the bendable display module depends on the minimum curvature radius of the bendable cover 902.

It should be noted that "the bendable cover 902 covers the outer surface of the display screen 901" may be that the bendable cover 902 is fitted to the outer surface of the display screen 901. The bonding manner includes using an OCA or a UV adhesive for bonding, welding, vacuum adsorption, or the like.

In an embodiment of this application, when the bendable display module is bent to form a bending structure, the display screen 901 is located on an inner side of the bending structure, and the bendable cover 902 is located on an outer side of the bending structure.

In a specific implementation of this embodiment, the outer surface of the display screen 901 is fitted to a hard surface of the bendable cover 902. Correspondingly, a flexible surface of the bendable cover 902 is an outer surface of the bending structure, and the inner surface of the display screen 901 is an inner surface of the bending structure. Optionally, when the flexible surface of the bendable cover 902 is the outer surface of the bendable display module, the flexible surface may be covered by a silver coating, an anti-fingerprint (AF) coating, or the like.

In another specific implementation of this embodiment, the outer surface of the display screen 901 is fitted to the flexible surface of the bendable cover 902. Correspondingly, the hard surface of the bendable cover 902 is the outer surface of the bending structure, and the inner surface of the display screen 901 is the inner surface of the bending structure.

In another embodiment of this application, when the bendable display module is bent to form the bending structure, the bendable cover 902 is located on the inner side of the bending structure, and the display screen 901 is located on the outer side of the bending structure.

In a specific implementation of this embodiment, the outer surface of the display screen 901 is fitted to the hard surface of the bendable cover 902. Correspondingly, the flexible surface of the bendable cover 902 is the inner surface of the bending structure, and the inner surface of the display screen 901 is the outer surface of the bending structure.

In another specific implementation of this embodiment, the outer surface of the display screen 901 is fitted to the flexible surface of the bendable cover 902. Correspondingly, the hard surface of the bendable cover 902 is the inner surface of the bending structure, and the inner surface of the display screen 901 is the outer surface of the bending structure.

It should be noted that, in this application, the hard surface of the bendable cover is opposite to the flexible surface of the bendable cover. The flexible surface of the bendable cover is a lower surface of the flexible substrate located inside the bendable cover. It should be learned that the lower surface of the flexible substrate is opposite to an upper surface of the flexible substrate.

Bendable Terminal Device.

Figure 10:
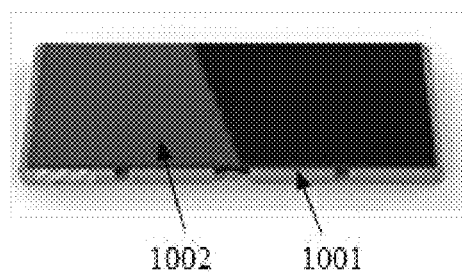
FIG. 10 is a structural diagram of a bendable terminal device according to this application.

FIG. 10 is a schematic structural diagram of a bendable terminal device according to this application. It should be learned that the terminal device may be a smartphone, a tablet computer, or another consumer electronic product. Further, the bendable terminal device includes a housing supporting part 1001 and the bendable display module 1002 as discussed in any one of the foregoing embodiments. The housing supporting part 1001 is a component configured to support and fasten the bendable display module 1002.

It should be noted that the housing supporting part in this application includes a housing, a printed circuit board (PCB), a chip, a sensor, an antenna, and the like of the terminal device. That is, all components included in the bendable terminal device than the bendable display module are included in the housing supporting part.

It should be noted that the housing supporting part in this application includes at least two housing supporting sub-parts and a connection mechanism (for example, a rotating shaft or a spring) for connecting two adjacent housing supporting sub-parts. The two adjacent housing supporting sub-parts may be folded using the connection mechanism. Because the bendable display module can be bent in a bidirectional manner, the two adjacent housing supporting sub-parts can rotate in a bidirectional manner using the connection structure.

In an embodiment of this application, when the bendable terminal device is bent, the housing supporting part 1001 is located on an inner side of the bendable terminal device, and the bendable display module 1002 is located on an outer side of the bendable terminal device.

It should be noted that, in this embodiment, because the housing supporting part 1001 is located on the inner side of the bendable terminal device, a curvature radius of the bendable display module 1002 is limited by a thickness of the housing supporting part 1001.

Figure 11:
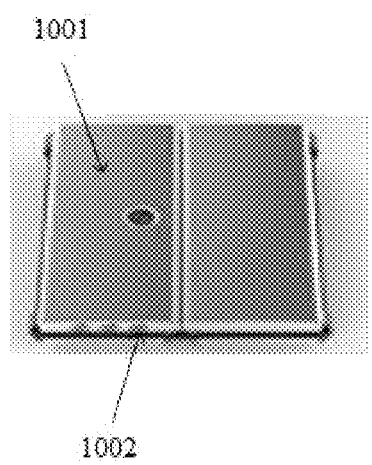
FIG. 11 is a structural diagram of the bendable terminal device shown in FIG. 10 when bent.

In another embodiment of this application, as shown in FIG. 11, when the bendable terminal device is bent, the housing supporting part 1001 is located on the outer side of the bendable terminal device, and the bendable display module 1002 is located on the inner side of the bendable terminal device.

It should be noted that, in this embodiment, the bendable display module 1002 can be usually bent only by 30 degrees because of a minimum curvature radius of the bendable display module 1002.

It should be noted that the foregoing plurality of embodiments are mutually referenced. For example, for a limitation on a fourth gel, refer to the limitation on the first gel. Details are not described herein again.

It should be noted that the foregoing embodiments are merely specific implementations of the present disclosure, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A bendable cover, comprising:
   a first hard plate;
   a second hard plate; and
   a flexible substrate comprising:
      an upper surface comprising:
         a first hard area bonded to the first hard plate using a first transparent bonding layer;
         a second hard area bonded to the second hard plate using a second transparent bonding layer; and
         a first bending area located between the first hard area and the second hard area, wherein each of the first hard area and the second hard area is adjacent to the first bending area;
      a first flexible substrate corresponding to the first hard area;
      a second flexible substrate corresponding to the second hard area; and
      a third flexible substrate corresponding to the first bending area, wherein the third flexible substrate is a first bending part,
   wherein, when the first bending part is bent, a minimum included angle between a planar surface on which an inner surface of a first hard part is located and a planar surface on which an inner surface of a second hard part is located is greater than or equal to 0 degrees and less than 180 degrees,
   wherein the inner surface of the first hard part faces the inner surface of the second hard part,
   wherein the first hard part and the second hard part each are in a shape of a slab,
   wherein the first hard part comprises the first flexible substrate, the first hard plate, and the first transparent bonding layer, and
   wherein the second hard part comprises the second flexible substrate, the second hard plate, and the second transparent bonding layer.

2. The bendable cover of claim 1, wherein a width of the first bending area is greater than or equal to πR, and wherein R is a minimum curvature radius of the first bending area.

3. The bendable cover of claim 1, wherein a projection of the first hard plate on a planar surface on which the first hard area is located overlaps the first hard area along a thickness direction of the first hard plate.

4. The bendable cover of claim 1, wherein a projection of the second hard plate on a planar surface on which the second hard area is located overlaps the second hard area along a thickness direction of the second hard plate.

5. The bendable cover of claim 1, wherein the first hard area comprises an inner edge and an outer edge, wherein the inner edge is a boundary between the first hard area and the first bending area, and wherein the outer edge is configured to overlap a part of an edge of the upper surface.

6. The bendable cover of claim 1, wherein a projection of the first hard part on the planar surface on which the inner surface of the second hard part is located is located inside the inner surface of the second hard part when the first bending part is bent along a thickness direction of the second hard part.

7. The bendable cover of claim 1, further comprising a transparent bonding layer comprising a light transmittance that is greater than or equal to 91%, wherein the transparent bonding layer comprises the first transparent bonding layer and the second transparent bonding layer.

8. The bendable cover of claim 1, wherein at least the third flexible substrate of the flexible substrate is glass film or plastic film.

9. The bendable cover of claim 1, wherein the first hard plate further comprises:
   a lower surface configured to face the first hard area;
   a second upper surface located opposite to the lower surface;
   an inner wall configured to face a side wall of the second hard plate; and
   a first curved surface located between the second upper surface and the inner wall, wherein the first curved surface is a convex surface, wherein the first curved surface comprises a first edge and a second edge that are opposite to each other, wherein an intersecting line between the first curved surface and the second upper surface is the first edge, wherein an intersecting line between the first curved surface and the inner wall is the second edge, and wherein the first curved surface is of curvature (G2) continuity from the first edge to the second edge.

10. The bendable cover of claim 9, further comprising an included angle area located between the inner wall and the first bending area and comprising a first gel, wherein the first gel comprises:

a second side wall configured to fit to the inner wall;
a second lower surface configured to fit to the first bending area; and
a second curved surface, wherein the second curved surface is a concave surface, wherein the second curved surface comprises a third edge and a fourth edge that are opposite to each other, wherein the third edge is an intersecting line between the second side wall and the second curved surface, wherein the fourth edge is an intersecting line between the second lower surface and the second curved surface, wherein the second curved surface is of G2 continuity from the third edge to the fourth edge, and wherein the third edge is configured to overlap the second edge.

11. The bendable cover of claim 10, wherein the first curved surface and the second curved surface are configured to form a continuous curved surface, and wherein the continuous curved surface is of G2 continuity from the first edge to the fourth edge.

12. The bendable cover of claim 1, further comprising a third hard plate, wherein the upper surface further comprises:
a third hard area configured to bond to the third hard plate using a third transparent bonding layer;
a second bending area located between the second hard area and the third hard area, wherein each of the second hard area and the third hard area is adjacent to the second bending area;
wherein, when a second bending part is bent, a minimum included angle between a planar surface on which an inner surface of a third hard part is located and the planar surface on which the inner surface of the second hard part is located is greater than or equal to 0 degrees and less than 180 degrees, and the inner surface of the third hard part faces the inner surface of the second hard part, the second bending part is a fourth flexible substrate corresponding to the second bending area, the third hard part is in a shape of a slab, the third hard part comprises a fifth flexible substrate corresponding to the third hard area, the third hard plate, and the third transparent bonding layer.

13. The bendable cover of claim 12, wherein a projection of the third hard part on the planar surface on which the inner surface of the second hard part is located is located inside the inner surface of the second hard part when the second bending part is bent along a thickness direction of the second hard part.

14. The bendable cover of claim 13, wherein a projection of the first hard part on the inner surface of the second hard plate and a projection of the third hard part on the inner surface of the second hard plate are separated from each other when both the first bending part and the second bending part are bent along the thickness direction of the second hard part.

15. A bendable display apparatus, comprising:
a display screen comprising a first outer surface; and
a bendable cover configured to cover the first outer surface, wherein the bendable cover comprises:
a first hard plate;
a second hard plate; and
a flexible substrate comprising:
an upper surface comprising:
a first hard area bonded to the first hard plate using a first transparent bonding layer;
a second hard area bonded to the second hard plate using a second transparent bonding layer; and
a first bending area located between the first hard area and the second hard area, wherein each of the first hard area and the second hard area is adjacent to the first bending area;
a first flexible substrate corresponding to the first hard area;
a second flexible substrate corresponding to the second hard area; and
a third flexible substrate corresponding to the first bending area, wherein the third flexible substrate is a first bending part,
wherein, when the first bending part is bent, a minimum included angle between a planar surface on which an inner surface of a first hard part is located and a planar surface on which an inner surface of a second hard part is located is greater than or equal to 0 degrees and less than 180 degrees,
wherein the inner surface of the first hard part faces the inner surface of the second hard part,
wherein the first hard part and the second hard part each are in a shape of a slab,
wherein the first hard part comprises the first flexible substrate, the first hard plate, and the first transparent bonding layer, and
wherein the second hard part comprises the second flexible substrate, the second hard plate, and the second transparent bonding layer.

16. The bendable display apparatus of claim 15, wherein the bendable display apparatus is configured to bend to form a bending structure, wherein the display screen is located on an inner side of the bending structure, and wherein the bendable cover is located on an outer side of the bending structure.

17. The bendable display apparatus of claim 16, wherein a flexible surface of the bendable cover is a second outer surface of the bending structure and an inner surface of the display screen is an inner surface of the bending structure when the first outer surface is in contact with a hard surface of the bendable cover, wherein the hard surface is the second outer surface and the inner surface of the display screen is the inner surface of the bending structure when the first outer surface is in contact with the flexible surface, wherein the hard surface is opposite to the flexible surface, wherein the flexible surface is a lower surface of the flexible substrate located inside the bendable cover, wherein the lower surface is opposite to the upper surface, and wherein the first outer surface is opposite to the inner surface of the display screen.

18. The bendable display apparatus of claim 15, wherein the bendable display apparatus is configured to bend to form a bending structure, wherein the display screen is located on an outer side of the bending structure, and wherein the bendable cover is located on an inner side of the bending structure.

19. The bendable display apparatus of claim 18, wherein a flexible surface of the bendable cover is an inner surface of the bending structure and an inner surface of the display screen is a second outer surface of the bending structure when the first outer surface is in contact with a hard surface of the bendable cover, wherein the hard surface is the inner surface of the bending structure and the inner surface of the display screen is the second outer surface when the first outer surface is in contact with the flexible surface, wherein the hard surface is opposite to the flexible surface, wherein the flexible surface is a lower surface of the flexible substrate located inside the bendable cover, wherein the lower surface is opposite to the upper surface, and wherein the first outer surface is opposite to the inner surface of the display screen.

20. A bendable terminal device, comprising:
a bendable display apparatus comprising:
- a display screen comprising an outer surface; and
- a bendable cover configured to cover the outer surface, wherein the bendable cover comprises:
- a first hard plate;
- a second hard plate; and
- a flexible substrate comprising:
  - an upper surface comprising:
    - a first hard area bonded to the first hard plate using a first transparent bonding layer;
    - a second hard area bonded to the second hard plate using a second transparent bonding layer; and
    - a first bending area located between the first hard area and the second hard area, wherein each of the first hard area and the second hard area is adjacent to the first bending area;
  - a first flexible substrate corresponding to the first hard area;
  - a second flexible substrate corresponding to the second hard area; and
  - a third flexible substrate corresponding to the first bending area, wherein the third flexible substrate is a first bending part,
wherein, when the first bending art is bent, a minimum included angle between a planar surface on which an inner surface of a first hard part is located and a planar surface on which an inner surface of a second hard part is located is greater than or equal to 0 degrees and less than 180 degrees,
wherein the inner surface of the first hard part faces the inner surface of the second hard part,
wherein the first hard part and the second hard part each are in a shape of a slab,
wherein the first hard part comprises the first flexible substrate, the first hard plate, and the first transparent bonding layer, and
wherein the second hard part comprises the second flexible substrate, the second hard plate, and the second transparent bonding layer; and
a stacked housing supporting part configured to support and fasten the bendable display apparatus.

* * * * *

UNITED STATES PATENT AND TRADEMARK OFFICE
CERTIFICATE OF CORRECTION

PATENT NO. : 11,252,835 B2
APPLICATION NO. : 16/811308
DATED : February 15, 2022
INVENTOR(S) : Ding Zhong et al.

It is certified that error appears in the above-identified patent and that said Letters Patent is hereby corrected as shown below:

In the Claims

Claim 20, Column 30, Line 4: "first bending art is bent, a" should read "first bending part is bent, a"

Signed and Sealed this
Third Day of May, 2022

Katherine Kelly Vidal
Director of the United States Patent and Trademark Office